(12) United States Patent
Kato et al.

(10) Patent No.: US 6,866,982 B2
(45) Date of Patent: Mar. 15, 2005

(54) RESIST COMPOSITION AND PATTERNING PROCESS

(75) Inventors: Hideto Kato, Gunma-ken (JP); Yoshinori Hirano, Gunma-ken (JP); Toshihiko Fujii, Gunma-ken (JP); Hiromasa Yamaguchi, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 26 days.

(21) Appl. No.: 10/329,456

(22) Filed: Dec. 27, 2002

(65) Prior Publication Data

US 2003/0175617 A1 Sep. 18, 2003

(30) Foreign Application Priority Data

Dec. 27, 2001 (JP) ........................................ 2001-396234

(51) Int. Cl.$^7$ ................................................ G03F 7/004
(52) U.S. Cl. ................................ 430/270.1; 430/272.1; 430/275.1; 430/326
(58) Field of Search ................................ 430/270.1, 272.1, 430/275.1, 326

(56) References Cited

U.S. PATENT DOCUMENTS 6,303,264 B1 * 10/2001 Fujie et al. .............. 430/270.1
6,432,608 B1 * 8/2002 Fujie et al. .............. 430/270.1

FOREIGN PATENT DOCUMENTS

| EP | 0 887 707 A1 | 12/1998 |
| JP | 3-47190 A | 2/1991 |
| JP | 6-118660 A | 4/1994 |
| JP | 11-30856 A | 2/1999 |
| JP | 11-30865 A | 2/1999 |
| JP | 11-109629 A | 4/1999 |
| JP | 11-352700 A | 12/1999 |

* cited by examiner

Primary Examiner—John S. Chu
(74) Attorney, Agent, or Firm—Birch, Stewart, Kolasch & Birch, LLP

(57) ABSTRACT

A resist composition comprising (A) a substantially alkali-insoluble polymer having acidic functional groups protected with acid labile groups, which becomes alkali soluble upon elimination of the acid labile groups, (B) a photoacid generator, and (C) a nonionic fluorinated organosiloxane compound consisting of perfluoroalkyl-containing siloxane bonds and polyoxyethylene type polyether bonds is exposed to UV having a wavelength of at least 150 nm and developed with an alkaline solution to form a pattern without leaving scum.

11 Claims, No Drawings

RESIST COMPOSITION AND PATTERNING PROCESS

This invention relates to a resist composition which is adapted for exposure to ultraviolet radiation having a wavelength of at least 150 nm (in the near UV and deep UV regions) and processed without leaving no resist residues known as scum, and a patterning process using the same.

BACKGROUND OF THE INVENTION

For resist compositions used in the microfabrication of semiconductor integrated circuits, one requirement is elimination of resist residues known as scum. The scum is an insolubilized component of resist that arises in the alkali development step following exposure. If scum is left after development, it can cause failures in the subsequent steps such as etching and electrolytic plating, giving rise to the fatal problem that the desirable finished shape cannot be obtained. Since a substantial reduction of line width is in progress in recent years, even the presence of slight scum can create a serious problem. One attempt to alleviate this problem from the developer side is to add specific surfactants to aqueous solutions of commonly used organic bases (such as tetramethylammonium hydroxide) as disclosed in JP-A 6-118660 and JP-A 11-352700.

Improvements have also been made from the resist material side. For resist compositions of the chemical amplification type, JP-A 11-030856, JP-A 11-030865 and JP-A 11-109629 propose the use of specific resins and photoacid generators. These attempts are to improve scum by tailoring the resin or photoacid generator, at the sacrifice of some of the performance factors required for resist materials. Therefore, there is a need for a technique of improving scum while permitting the resin and photoacid generator to be selected from wide ranges.

SUMMARY OF THE INVENTION

An object of the invention is to provide a resist composition and a patterning process which will leave no scum.

It has been found that no scum is generated after exposure to ultraviolet radiation when a small amount of a nonionic fluorinated organosiloxane compound consisting of perfluoroalkyl-containing siloxane bonds and polyoxyethylene type polyether bonds is added to a resist composition comprising a substantially alkali-insoluble polymer having acidic functional groups protected with acid labile groups, which becomes alkali soluble when the acid labile groups are eliminated, a photoacid generator, and optionally, a basic compound.

Therefore, the present invention provides a resist composition for use with an exposure light source of ultraviolet radiation having a wavelength of at least 150 nm, comprising (A) a substantially alkali-insoluble polymer having acidic functional groups protected with acid labile groups, which becomes alkali soluble upon elimination of the acid labile groups, (B) a photoacid generator, and (C) at least one nonionic fluorine compound selected from among nonionic fluorinated organosiloxane compounds consisting of perfluoroalkyl-containing siloxane bonds and polyoxyethylene type polyether bonds.

In one preferred embodiment, the nonionic fluorine compound (C) has the following general formula (4):

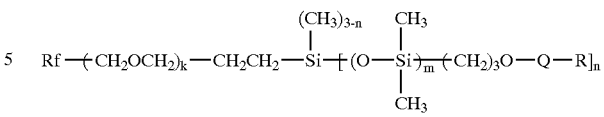

wherein Rf is a perfluoroalkyl group of 4 to 10 carbon atoms or a perfluoropolyether group of 5 to 14 carbon atoms, Q is a polyether group composed of a polyethylene glycol chain and/or polypropylene glycol chain, R is hydrogen, an allyl group, an alkyl group of 1 to 4 carbon atoms, or an acyl group of 2 to 3 carbon atoms, k and m each are 0 or 1, and n is an integer of 1 to 3, and is present in an amount of 100 to 8,000 ppm based on the solids in the composition. The resist composition may further contain (D) a basic compound.

Also contemplated herein is a process for forming a resist pattern comprising the steps of applying the resist composition onto a substrate to form a coating; heat treating the coating and then exposing it to ultraviolet radiation having a wavelength of at least 150 nm through a photomask; and optionally heat treating the exposed coating and developing it with a developer.

DESCRIPTION OF THE PREFERRED EMBODIMENTS

Component (A) in the resist composition of the invention is a substantially alkali-insoluble polymer having acidic functional groups protected with acid labile groups, which becomes alkali soluble upon elimination of the acid labile groups. As used herein, the term "substantially alkali-insoluble" means that the polymer is insoluble or difficultly soluble in alkali. Typical polymers are those comprising recurring units of the following general formula (1) and having a weight average molecular weight (Mw) of 3,000 to 300,000:

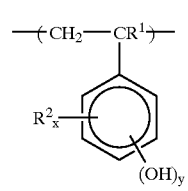

wherein $R^1$ is hydrogen or methyl, $R^2$ is a straight, branched or cyclic alkyl group of 1 to 8 carbon atoms, x is 0 or a positive integer, y is a positive integer, the sum of x+y is 5 or less, and wherein hydrogen atoms of some phenolic hydroxyl groups are partially substituted with acid labile groups of one or more type, in a proportion of more than 0 mol % to 80 mol %, preferably 7 to 50 mol %, on the average, based on the entire hydrogen atoms of phenolic hydroxyl groups. Especially preferred are monodisperse polymers of hydroxystyrene and derivatives thereof in which hydrogen atoms of phenolic hydroxyl groups are partially substituted with acid labile groups. The term "monodisperse" means that the polymer has a dispersity or molecular weight distribution (Mw/Mn) of 1.0 to 1.5, preferably 1.0 to 1.3.

The acid labile group is selected from a variety of such groups, and especially from among groups of the following general formulae (2) and (3), tert-alkyl groups, trialkylsilyl groups and ketoalkyl groups.

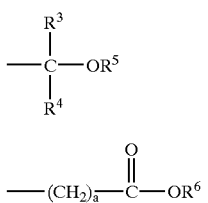

In formula (2), $R^3$ and $R^4$ are each independently hydrogen or a straight or branched alkyl group of 1 to 6 carbon atoms, and $R^5$ is a straight, branched or cyclic alkyl group of 1 to 10 carbon atoms. Alternatively, a pair of $R^3$ and $R^4$, a pair of $R^3$ and $R^5$ or a pair of $R^4$ and $R^5$ may bond together to form a ring, and each of $R^3$, $R^4$ and $R^5$ is independently a straight or branched alkylene group of 1 to 6 carbon atoms when they form a ring.

Illustrative examples of the group of formula (2) include straight or branched acetal groups such as 1-ethoxyethyl, 1-n-propoxyethyl, 1-isopropoxyethyl, 1-n-butoxyethyl, 1-isobutoxyethyl, 1-sec-butoxyethyl, 1-tert-butoxyethyl, 1-tert-amyloxyethyl, 1-ethoxy-n-propyl and 1-cyclohexyloxyethyl; and cyclic acetal groups such as tetrahydrofuranyl. Of these, 1-ethoxyethyl and 1-ethoxy-n-propyl are preferred.

In formula (3), $R^6$ is a tertiary alkyl group having 4 to 12 carbon atoms, preferably 4 to 8 carbon atoms, more preferably 4 to 6 carbon atoms, and "a" is an integer of 0 to 6.

Illustrative examples of the group of formula (3) include tert-butoxycarbonyl, tert-butoxycarbonylmethyl, tert-amyloxycarbonyl and tert-amyloxycarbonylmethyl.

Suitable tert-alkyl groups include tert-butyl, tert-amyl and 1-methylcyclohexyl.

Suitable trialkylsilyl groups include those in which each alkyl has 1 to 6 carbon atoms, such as trimethylsilyl, triethylsilyl and dimethyl-tert-butylsilyl.

Suitable ketoalkyl groups include 3-oxocyclohexyl and groups of the following formulae.

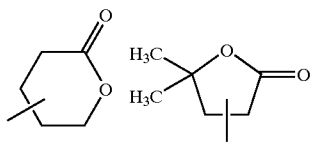

Component (B) is a photoacid generator, which is typically selected from oxime sulfonate compounds, onium salts, β-ketosulfone derivatives, diazomethane derivatives, disulfone derivatives, sulfonic acid ester derivatives, and imidoyl sulfonate derivatives, but not limited thereto.

Examples of suitable oxime sulfonate compounds include α-(p-toluenesulfonyloxyimino)phenylacetonitrile, α-(p-chlorobenzenesulfonyloxyimino)phenylacetonitrile, α-(4-nitrobenzenesulfonyloxyimino)phenylacetonitrile, α-(4-nitro-2-trifluoromethylbenzenesulfonyloxyimino) phenylacetonitrile, α-(benzenesulfonyloxyimino)-4-chlorophenylacetonitrile, α-(benzenesulfonyloxyimino)-2, 4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylphenylacetonitrile, α-(4-dodecylbenzenesulfonyloxyimino)phenylacetonitrile, α-(4-toluenesulfonyloxyimino)-4-methoxyphenylacetonitrile, α-(4-dodecylbenzenesulfonyloxyimino)-4-methoxyphenylacetonitrile and α-(4-toluenesulfonyloxyimino)-3-thienylacetonitrile.

Examples of suitable onium salts include diphenyliodonium trifluoromethanesulfonate, (p-tert-butoxyphenyl) iodonium trifluoromethanesulfonate, diphenyliodonium p-toluenesulfonate, (p-tert-butoxyphenyl)iodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate and dicyclohexylphenylsulfonium p-toluenesulfonate.

Illustrative examples of β-ketosulfone derivatives include 2-cyclohexylcarbonyl-2-(p-toluenesulfonyl)propane and 2-isopropylcarbonyl-2-(p-toluenesulfonyl)propane.

Illustrative examples of diazomethane derivatives include bis(benzenesulfonyl)diazomethane, bis(cyclohexylsulfonyl) diazomethane and bis(tert-butylsulfonyl)diazomethane.

Examples of disulfone derivatives include diphenyl disulfone and dicyclohexyl disulfone. Examples of sulfonic acid ester derivatives include 1,2,3-tris (methanesulfonyloxy)benzene, 1,2,3-tris (trifluoromethanesulfonyloxy)benzene and 1,2,3-tris(p-toluenesulfonyloxy)benzene. Specific examples of imidoyl sulfonate derivatives include phthalimidoyl triflate, phthalimidoyl tosylate, 5-norbornene-2,3-dicarboxyimidoyl triflate, 5-norbornene-2,3-dicarboxyimidoyl tosylate and 5-norbornene-2,3-dicarboxylimidoyl n-butylsulfonate.

The photoacid generator is added in an amount of preferably 0.5 to 15 parts, and especially 1 to 8 parts, per 80 parts of the polymer (A) (all parts here and below are by weight). At less than 0.5 part, the sensitivity tends to be poor. On the other hand, the addition of more than 15 parts may lower the resolution of the resist composition and result in the presence of excess monomer, possibly reducing the heat resistance of the composition.

Component (C) is a nonionic fluorinated organosiloxane compound consisting of perfluoroalkyl-containing siloxane bonds and polyoxyethylene type polyether bonds, that is, a compound in which siloxane groups having perfluoroalkyl groups are bonded with polyoxyethylene type polyether groups. Preferred nonionic fluorine compounds have the general formula (4):

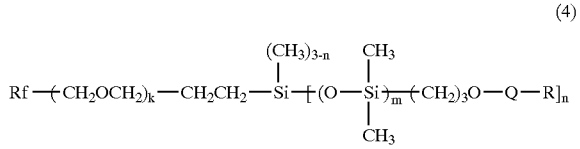

(4)

wherein Rf is a perfluoroalkyl group of 4 to 10 carbon atoms or a perfluoropolyether group of 5 to 14 carbon atoms, Q is a polyether group composed of a polyethylene glycol chain and/or polypropylene glycol chain, R is hydrogen, an allyl group, an alkyl group of 1 to 4 carbon atoms, or an acyl group of 2 to 3 carbon atoms, k and m each are 0 or 1, and n is an integer of 1 to 3.

The perfluoroalkyl group of Rf is represented by $C_pF_{2p+1}$ wherein p is an integer of 4 to 10, and the perfluoropolyether group of Rf preferably has the following formula:

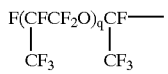

wherein q is an integer of 1 to 4.

The polyether group of Q preferably has the following formula:

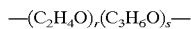

wherein r is an integer of 0 to 50, especially 2 to 40, s is an integer of 0 to 50, and r+s is an integer of 0 to 100.

Examples of the compounds of formula (4) are described, for example, in JP-A 3-47190.

In the inventive resist composition, the nonionic fluorine compounds (C) may be used alone or in admixture of two or more. The amount of nonionic fluorine compound included is generally 100 to 8,000 ppm, preferably 100 to 6,000 ppm, based on the weight of solids in the composition. Less than 100 ppm of the nonionic fluorine compound may lead to coating unevenness known as striation whereas more than 8,000 ppm may lower the softening temperature of the composition.

The basic compounds (D) are desirably those capable of suppressing the rate at which the acid generated by the photoacid generator diffuses within the resist film. The incorporation of such a basic compound within the resist composition holds down the rate of acid diffusion within the resist film, resulting in better resolution and suppressing changes in sensitivity following exposure. In addition, it reduces the dependence of the process on substrate and environmental factors, and improves the exposure latitude and the pattern profile.

Suitable basic compounds (D) include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives and imide derivatives.

Examples of suitable primary aliphatic amines include ammonia, methylamine, ethylamine, n-propylamine, iso-butylamine, sec-butylamine and tert-butylamine. Examples of suitable secondary aliphatic amines include dimethylamine, diethylamine, di-n-propylamine, di-iso-propylamine, di-n-butylamine, di-iso-butylamine and di-sec-butylamine. Examples of suitable tertiary aliphatic amines include trimethylamine, triethylamine, tri-n-propylamine, tri-iso-propylamine, tri-n-butylamine, tri-iso-butylamine and tri-sec-butylamine.

Suitable mixed amines include dimethylethylamine, methylethylpropylamine, benzylamine, phenethylamine and benzyldimethylamine. Suitable aromatic and heterocyclic amines include aniline, N,N-dimethylaniline, pyridine, quinoline and 1,8-diazabicycloundecene.

Suitable carboxyl group-bearing nitrogenous compounds include aminobenzoic acid, indolecarboxylic acid, nicotinic acid and alanine. Suitable sulfonyl group-bearing nitrogenous compounds include 3-pyridinesulfonic acid and pyridinium p-toluenesulfonate.

Suitable hydroxyl group-bearing nitrogenous compounds, hydroxyphenyl group-bearing nitrogenous compounds and alcoholic nitrogenous compounds include 2-hydroxypyridine, aminocresol, 2,4-quinolinediol, 3-indolemethanol hydrate, triethanolamine, N-ethyldiethanolamine and piperidine ethanol.

Suitable amide derivatives include formamide, N-methylformamide, N,N-dimethylformamide, acetamide, N-methylacetamide, N,N-dimethylacetamide, propionamide and benzamide. Suitable imide derivatives include phthalimide, succinimide and maleimide.

The basic compound may be used singly or in combinations of two or more thereof, and is typically included in an amount of 0 to 2 parts, and preferably 0.01 to 1 part, per 80 parts of the polymer (A). The use of more than 2 parts may result in too low a sensitivity.

Organic solvents that may be used in the resist composition of the invention include ketones such as cyclohexanone, 2-heptanone, 3-heptanone and 4-heptanone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, propylene glycol dimethyl ether, diethylene glycol dimethyl ether, ethylene glycol tert-butyl ether methyl ether (1-tert-butoxy-2-methoxyethane) and ethylene glycol tert-butyl ether ethyl ether (1-tert-butoxy-2-ethoxyethane); and esters such as propylene glycol monomethyl ether acetate, propylene glycol monoethyl ether acetate, ethyl lactate, ethyl pyruvate, butyl acetate, methyl-3-methoxypropionate, ethyl-3-ethoxypropionate, tert-butyl acetate, tert-butyl propionate and methyl-β-methoxyisobutyrate. Of the above, preferred organic solvents include 1-ethoxy-2-propanol, in which the resist components have an excellent solubility, and propylene glycol monomethyl ether acetate (both the α- and β-forms), in which the resist components have both an excellent solubility and an excellent stability. Any one or combinations of two or more of the above organic solvents may be used.

The organic solvent is added in an amount of preferably 90 to 600 parts, and especially 100 to 500 parts, per 80 parts of the polymer (A).

Besides the foregoing components, the inventive resist composition may include optional components. The optional components may be added in conventional amounts insofar as this does not compromise the objects of the invention. Typically, a light-absorbing compound may be included for reducing diffuse reflection from the substrate. A 1,2-naphthoquinonediazidosulfonyl group-bearing compound and a dissolution promoter also may be blended.

Suitable examples of the light-absorbing compound include azo compounds such as 2-benzeneazo-4-methylphenol and 4-hydroxy-4'-dimethylaminoazobenzene, and curcumin.

The 1,2-naphthoquinonediazidosulfonyl group-bearing compound is exemplified by compounds which contain on the molecule the 1,2-naphthoquinonediazidosulfonyl group of general formula (5) or (6) below.

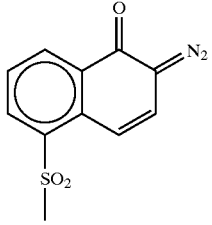
(5)

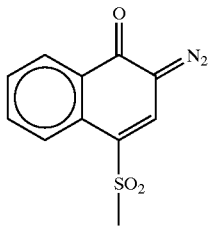
(6)

Preferred examples of the compounds into which a 1,2-naphthoquinonediazidosulfonyl group can be introduced include trihydroxybenzophenones, tetrahydroxybenzophenones, phenolic hydroxyl group-bearing ballast molecules of general formula (7) below, and novolac resins comprising recurring units of formula (12) below and having a weight-average molecular weight in a range of 2,000 to 20,000, and preferably 3,000 to 10,000.

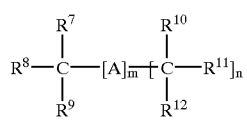
(7)

In above formula (7), $R^7$ to $R^{12}$ are each independently hydrogen, methyl, or a group of formula (8) or (9) below. The letter m is an integer from 0 to 2, and the letter n is an integer from 0 to 2, with the proviso that m is 1 or 2 if n is 0. When m is 1 and n is 0, A is hydrogen, methyl or a group of formula (8). When m is 2 and n is 0, one A moiety is methylene or a group of formula (10) below and the other A moiety is hydrogen, methyl or a group of formula (8). When n is 1, A is methylene or a group of formula (10). When m is 1 and n is 2, A is methine or a group of formula (11) below. When m is 2 and n is 2, one A moiety is methylene or a group of formula (10) and the other A moiety is methine or a group of formula (11).

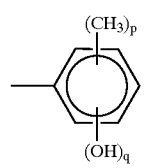
(8)

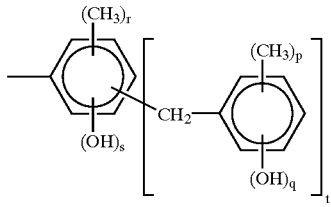
(9)

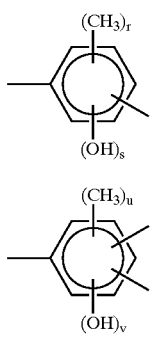
(10)
(11)

In formulas (8) to (11), p, q, r, s, t, u and v are each an integer from 0 to 3, such that p+q≦5, r+s≦4 and u+v≦3.

The preferred ballast molecule of formula (7) above is a low polynuclear compound which generally contains from 2 to 20, preferably 2 to 10, and most preferably 3 to 6, benzene rings. The ratio in the number of phenolic hydroxyl groups to the number of benzene rings is from 0.5 to 2.5, preferably from 0.7 to 2.0, and most preferably from 0.8 to 1.5.

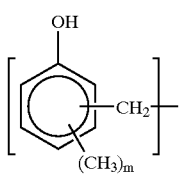
(12)

Herein, m is an integer from 0 to 3.

The novolac resin comprising recurring groups of formula (12) can be prepared by using a conventional process to effect condensation between at least one phenol of formula (13) below and an aldehyde.

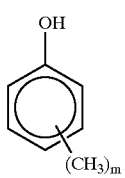
(13)

In formula (13), m is an integer from 0 to 3. Specific examples of the phenol include o-cresol, m-cresol, p-cresol and 3,5-xylenol. Specific examples of the aldehyde include formaldehyde, paraformaldehyde, acetaldehyde and benzaldehyde. Formaldehyde is preferred.

The molar ratio of the phenol of formula (13) to the aldehyde is preferably from 0.2 to 2, and especially from 0.3 to 2.

The method of introducing 1,2-naphthoquinonediazidosulfonyl groups into the above compounds preferably involves a dehydrochlorination condensation reaction between 1,2-naphthoquinonediazidosulfonyl chloride and a phenolic hydroxyl group in the presence of a basic catalyst. If the starting compound is a ballast molecule of formula (2), a trihydroxybenzophenone, or a tetrahydroxybenzophenone, the proportion of the phenolic hydroxyl group hydrogens that are substituted with 1,2-naphthoquinonediazidosulfonyl groups is preferably 10 to 100 mol %, and especially 50 to 100 mol %. If the starting compound is a novolac resin of formula (11), the proportion of the phenolic hydroxyl group hydrogens that are substituted with 1,2-naphthoquinonediazidosulfonyl groups is preferably 2 to 50 mol %, and especially 3 to 27 mol %.

The amount of the 1,2-naphthoquinonediazidosulfonyl group-bearing compound included in the resist composition of the invention is preferably from 0.1 to 15 parts, and especially from 0.5 to 10 parts, per 80 parts of the polymer (A). At less than 0.1 part, the resist composition may have too low a resolution, whereas the presence of more than 15 parts tends to reduce the sensitivity.

The dissolution promoter is typically a low polynuclear compound of formula (7) above which has phenolic hydroxyl groups and from 2 to 20, preferably from 2 to 10, and most preferably from 3 to 6, benzene rings. The ratio in the number of phenolic hydroxyl groups to the number of benzene rings in the compound is 0.5 to 2.5, preferably from 0.7 to 2.0, and most preferably from 0.8 to 1.5.

Specific examples of suitable low polynuclear compounds include those shown below.

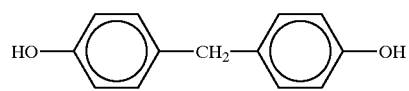
(E-1)

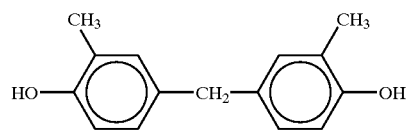
(E-2)

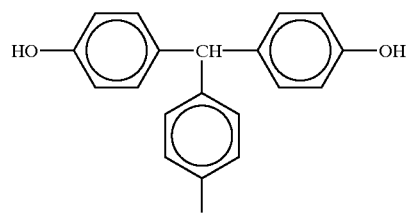
(E-3)

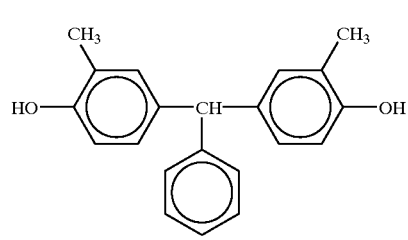
(E-4)

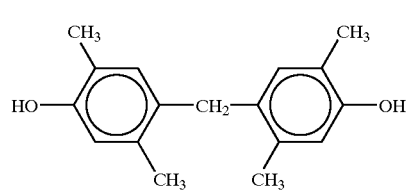
(E-5)

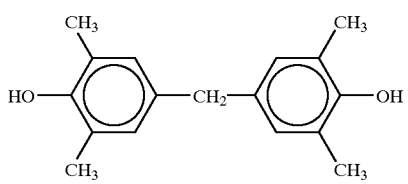
(E-6)

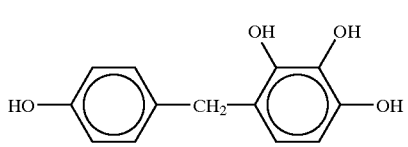
(E-7)

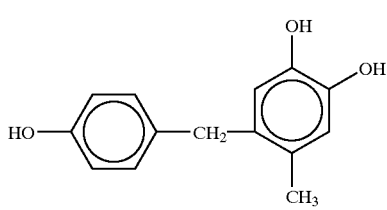
(E-8)

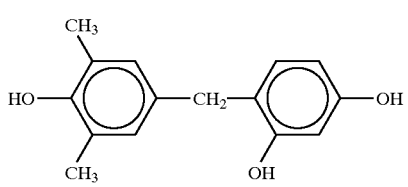
(E-9)

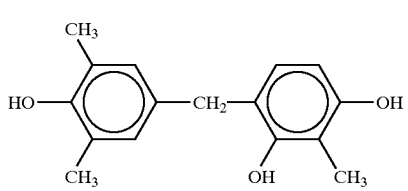
(E-10)

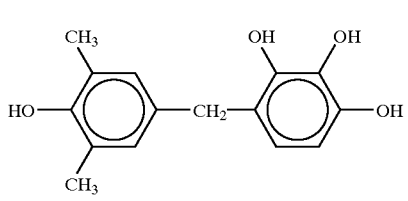
(E-11)

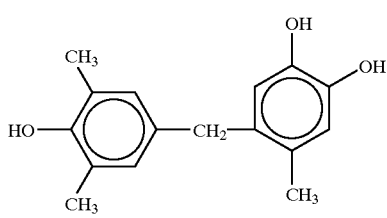
(E-12)

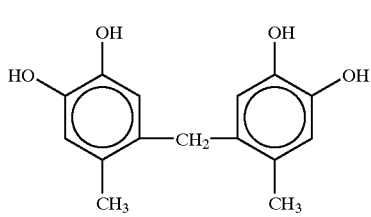
(E-13)

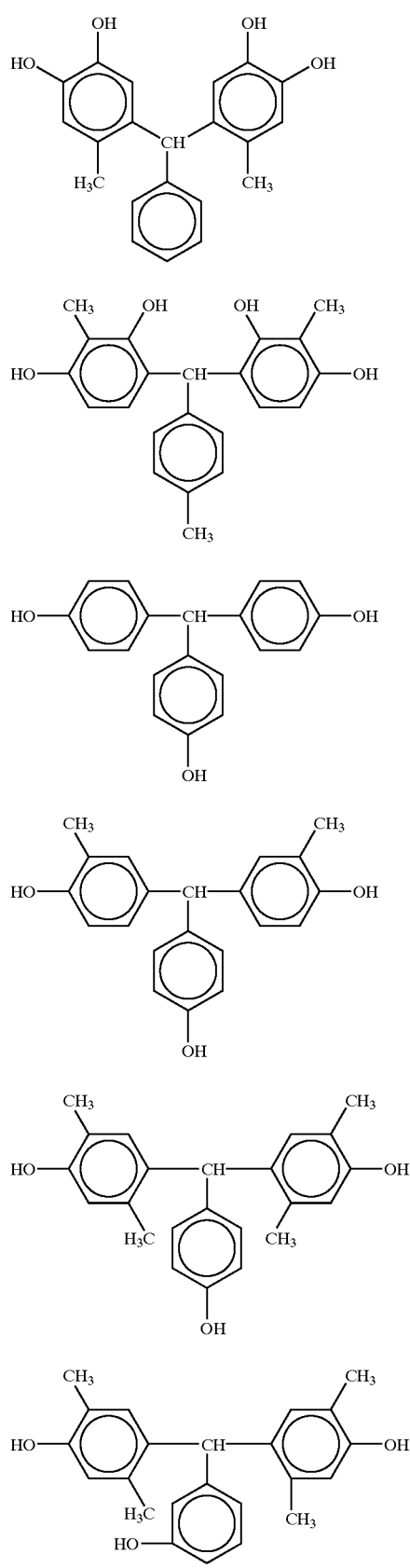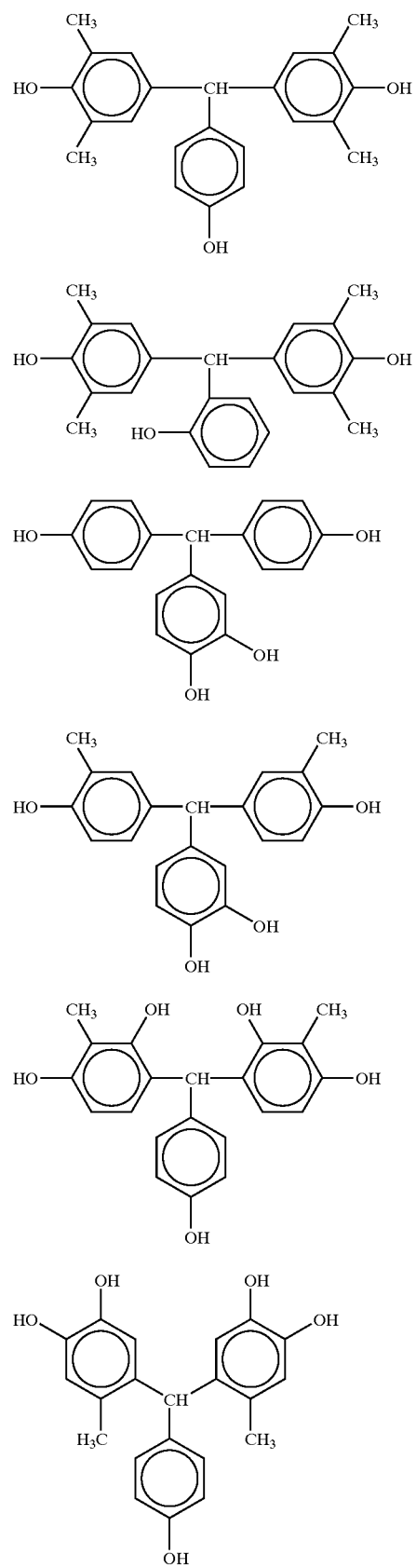

(E-26)
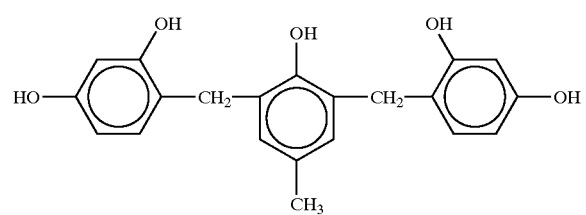
(E-27)
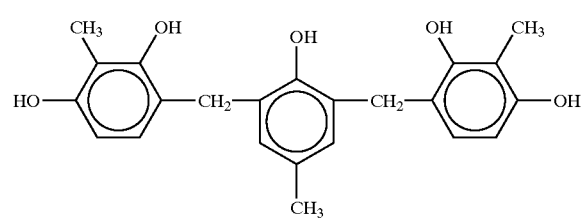
(E-28)
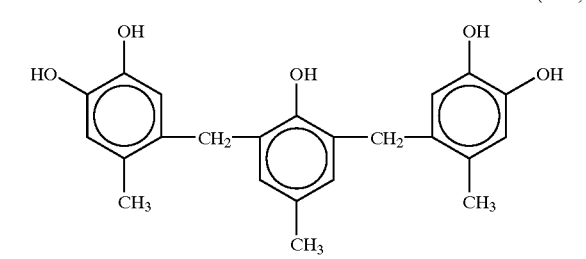
(E-29)
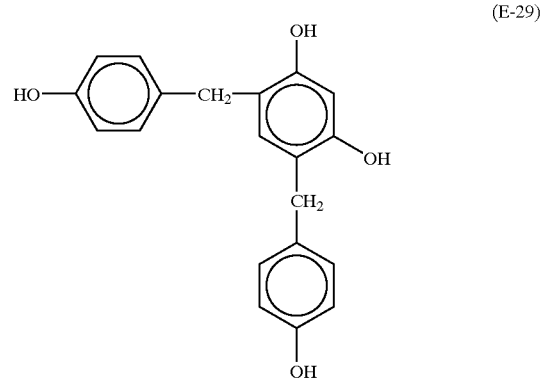
(E-30)
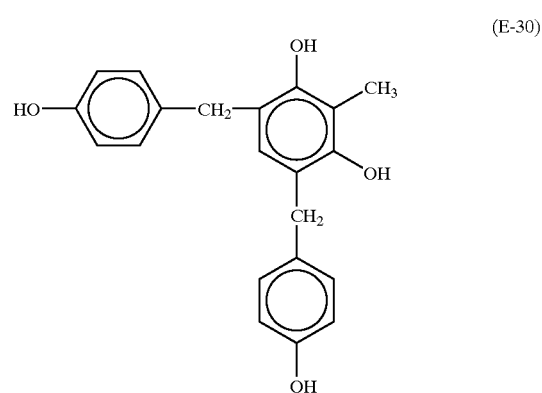
(E-31)
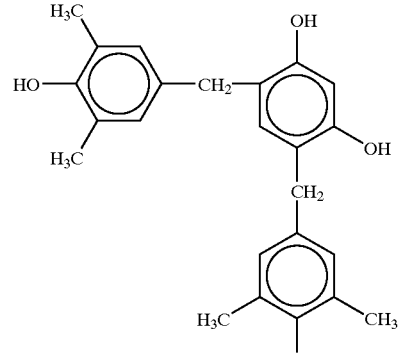
(E-32)
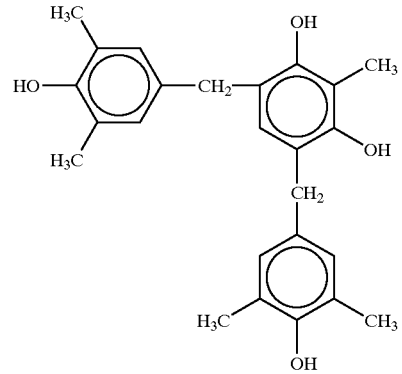
(E-33)
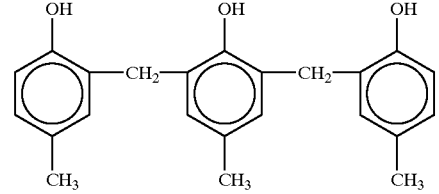
(E-34)
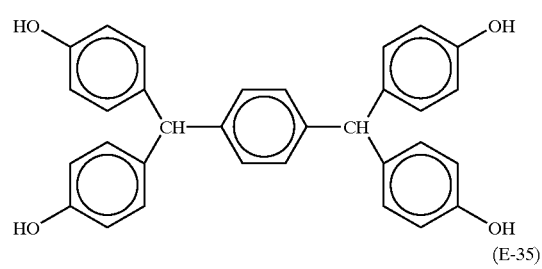
(E-35)
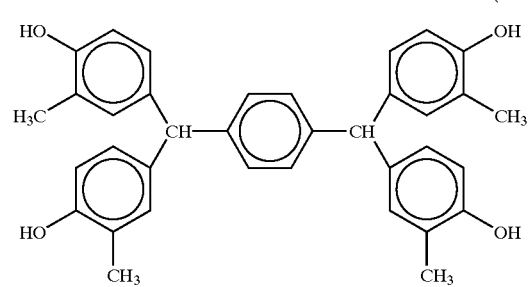

(E-36)
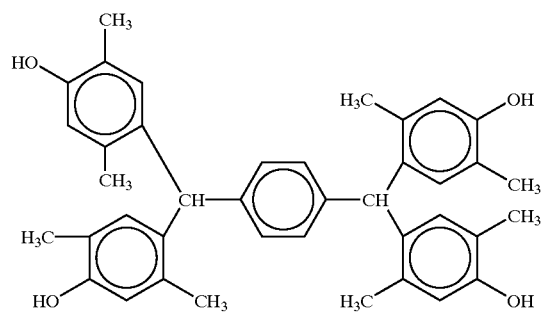
(E-41)
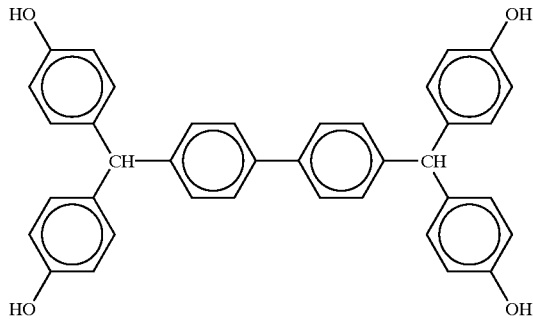
(E-37)
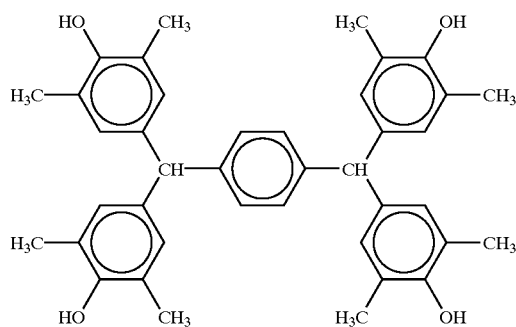
(E-42)
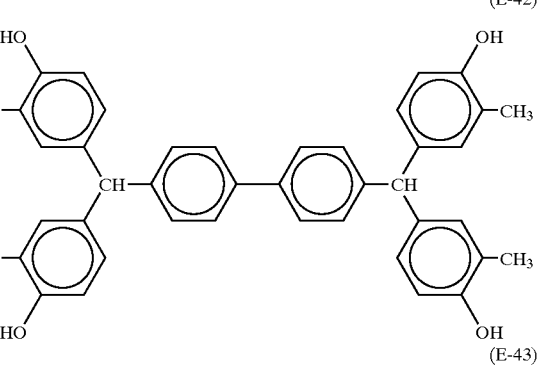
(E-38)
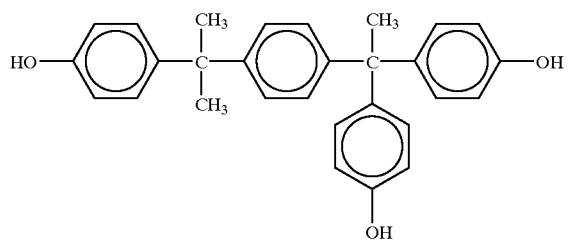
(E-43)
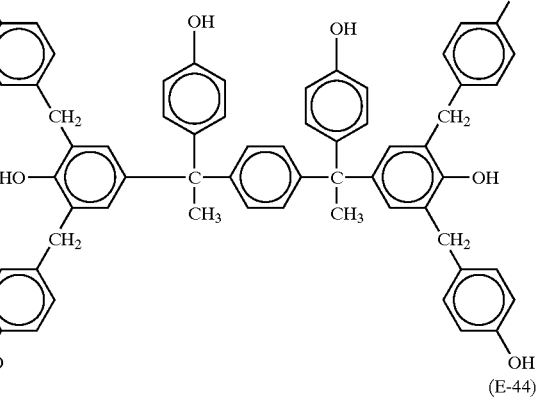
(E-39)
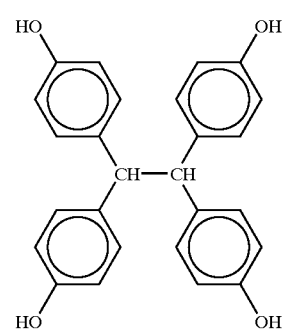
(E-44)
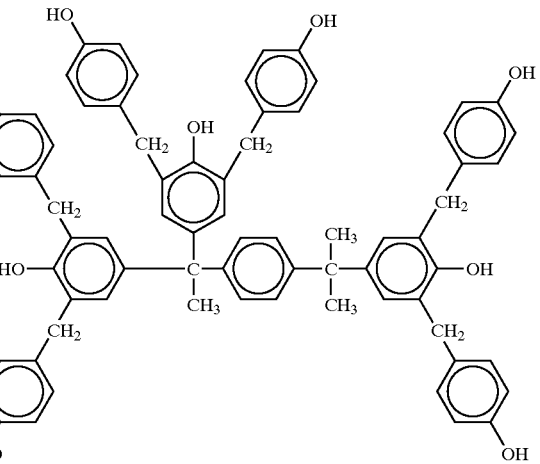
(E-40)
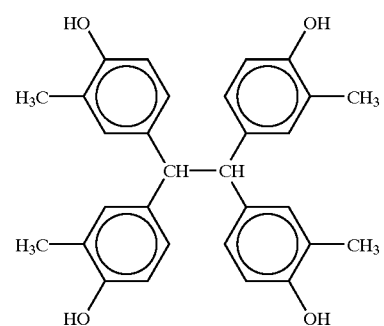
The dissolution promoter may be used singly or as combinations of two or more thereof, and is typically included in an amount of 0 to 10 parts, and preferably 0.05 to 5 parts, per 80 parts of the polymer (A). The use of more than 10 parts may lower the resolution and thermal stability of the resist.

In patterning with the resist composition of the invention, the resist composition is first applied to a substrate by a known technique. The type of substrate is not critical, although Si, Ni, Fe, Zn, Mg, Co, Al, Pt, Pd, Ta, Au, Cu, Ti, Cr, NiFe, SiON, alumina, and other oxide film and nitride film substrates are exemplified. The thickness of the resist film is preferably 0.01 to 100 μm, more preferably 2 to 50 μm, although not limited thereto. The applied resist film is then heated preferably at 90 to 130° C. for a period of 1 to 15 minutes, following which it is exposed to light through a photomask. In the practice of the invention, exposure is carried out using ultraviolet light having a wavelength of at least 150 nm, preferably at least 193 nm, more preferably at least 248 nm. The ultraviolet light may be i-line, h-line or g-line. Following exposure, the resist may be heat-treated if necessary, and preferably at 70 to 130° C. for 1 to 5 minutes, after which development is carried out with a developer. Examples of developers that may be used for this purpose include aqueous solutions of organic alkalis such as tetramethylammonium hydroxide (TMAH) and aqueous solutions of inorganic alkalis such as sodium hydroxide, potassium hydroxide or potassium metaborate. This process yields a positive pattern.

EXAMPLE

Examples of the invention and comparative examples are provided by way of illustration and not by way of limitation. All parts are by weight.

Examples 1 to 3 and Comparative Examples 1 to 4

A resist solution was prepared by dissolving 80 parts of a base resin having recurring units shown below (designated Polym-1), 2 parts of a photoacid generator (designated PAG-1), and 0.1 part of triethanol amine as the basic compound in propylene glycol monomethyl ether acetate and adding thereto an amount of a nonionic fluorine compound as shown in Table 1. The resist solution was passed through a membrane filter having a pore size of 0.2 μm. The resist solution was spin-coated onto a Si or NiFe substrate, then soft-baked on a hot plate at 120° C. for 120 seconds to form a resist film of 2.00 μm thick. Next, the resist film was exposed through a reticle using an i-line stepper (NSR-1755i7A, by Nikon Corporation; NA=0.50), and post-exposure baked at 80° C. for 120 seconds. The resist film was then developed for 100 seconds with a 2.38% by weight aqueous solution of tetramethylammonium hydroxide, rinsed with deionized water and dried, giving a pattern.

For the resist pattern on the Si substrate, observation under a scanning electron microscope (SEM) was made at the exposure dose providing 1:1 resolution to a 1.5 μm line-and-space. The resist pattern was rated no scum or "Pass" in Table 2 when the pattern shape was satisfactory and no resist residues were found in the space region. The resist pattern was rated "Reject" in Table 2 when the pattern shape was unsatisfactory and scum was found. For the resist pattern on the NiFe substrate, observation was made at the exposure dose providing an actual size within 0.60±0.02 μm when an isolated mask of 0.60 μm was used. The resist pattern was rated as on the Si substrate. The results are shown in Table 2.

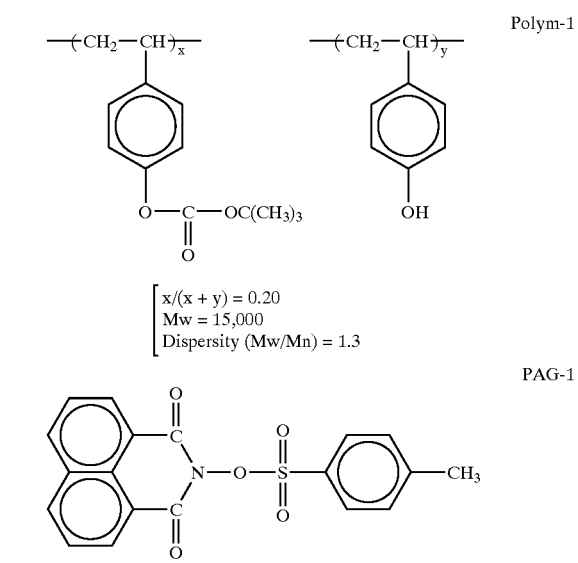

TABLE 1

| | Nonionic fluorine compound | |
|---|---|---|
| | Type | Amount (ppm) |
| Example 1 | formula (i) | 100 |
| Example 2 | formula (i) | 2000 |
| Example 3 | formula (i) | 8000 |
| Comparative Example 1 | FC-430 | 500 |
| Comparative Example 2 | FC-430 | 5000 |
| Comparative Example 3 | F-815 | 800 |
| Comparative Example 4 | S-141 | 1000 |

$$(C_8F_{17}CH_2CH_2Si(CH_3)_2(CH_2)_3O(CH_2CH_2O)_{10}CH_3) \quad (i)$$

FC-430 is a nonionic fluorine compound by Sumitomo 3M Co., Ltd.
F-815 is a nonionic fluorine compound by Dainippon Ink & Chemical Inc.
S-141 is a nonionic fluorine compound by Asahi Glass Co., Ltd.

TABLE 2

| | Si substrate | NiFe substrate |
|---|---|---|
| Example 1 | Pass | Pass |
| Example 2 | Pass | Pass |
| Example 3 | Pass | Pass |
| Comparative Example 1 | Pass | Reject |
| Comparative Example 2 | Reject | Reject |
| Comparative Example 3 | Pass | Reject |
| Comparative Example 4 | Reject | Reject |

Examples 4, 5 and Comparative Examples 5, 6

A resist solution was prepared by dissolving 80 parts of the base resin having recurring units shown above (designated Polym-1), 3 parts of a photoacid generator (designated PAG-2), and 0.1 part of triethanol amine as the basic compound in propylene glycol monomethyl ether acetate and adding thereto an amount of a nonionic fluorine compound as shown in Table 3. The resist solution was passed through a membrane filter having a pore size of 0.2 μm. The resist solution was spin-coated onto a Si or NiFe substrate, then soft-baked on a hot plate at 120° C. for 120 seconds to form a resist film of 2.00 μm thick. Next, the resist film was exposed through a reticle using an Excimer laser stepper (NSR-2005EX, by Nikon Corporation; NA=0.50), and post-exposure baked at 100° C. for 120 seconds. The resist film was then developed for 100 seconds with a 2.38% by weight aqueous solution of tetramethylammonium hydroxide, rinsed with deionized water and dried, giving a pattern.

For the resist pattern on the Si substrate, observation under a scanning electron microscope (SEM) was made at the exposure dose providing 1:1 resolution to a 0.60 μm line-and-space. The resist pattern was rated no scum or "Pass" in Table 4 when the pattern shape was satisfactory and no resist residues were found in the space region. The resist pattern was rated "Reject" in Table 4 when the pattern shape was unsatisfactory and scum was found. For the resist pattern on the NiFe substrate, observation was made at the exposure dose providing an actual size within 0.30±0.01 μm when an isolated mask of 0.30 μm was used. The resist pattern was rated as on the Si substrate. The results are shown in Table 4.

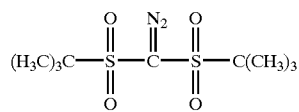

PAG-2

TABLE 3

| | Nonionic fluorine compound | |
| --- | --- | --- |
| | Type | Amount (ppm) |
| Example 4 | formula (i) | 100 |
| Example 5 | formula (i) | 8000 |
| Comparative Example 5 | FC-430 | 500 |
| Comparative Example 6 | S-141 | 1000 |

FC-430 is a nonionic fluorine compound by Sumitomo 3M Co., Ltd.
S-141 is a nonionic fluorine compound by Asahi Glass Co., Ltd.

TABLE 4

| | Si substrate | NiFe substrate |
| --- | --- | --- |
| Example 4 | Pass | Pass |
| Example 5 | Pass | Pass |
| Comparative Example 5 | Pass | Reject |
| Comparative Example 6 | Reject | Reject |

There has been described a resist composition which is exposed to UV having a wavelength of at least 150 nm and processed to form a pattern without leaving scum.

Japanese Patent Application No. 2001-396234 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition for use with an exposure light source of ultraviolet radiation having a wavelength of at least 150 nm, comprising (A) a substantially alkali-insoluble polymer having acidic functional groups protected with acid labile groups, which becomes alkali soluble upon elimination of the acid labile groups, (B) a photoacid generator, and (C) at least one nonionic fluorine compound selected from among nonionic fluorinated organosiloxane compounds consisting of perfluoroalkyl-containing siloxane bonds and polyoxyethylene type polyether bonds.

2. A resist composition for use with an exposure light source of ultraviolet radiation having a wavelength of at least 150 nm, comprising (A) a substantially alkali-insoluble polymer having acidic functional groups protected with acid labile groups, which becomes alkali soluble upon elimination of the acid labile groups, (B) a photoacid generator, and (C) at least one nonionic fluorine compound selected from among nonionic fluorinated organosiloxane compounds consisting of perfluoroalkyl-containing siloxane bonds and polyoxyethylene type polyether bonds wherein the nonionic fluorine compound (C) has the general formula (4):

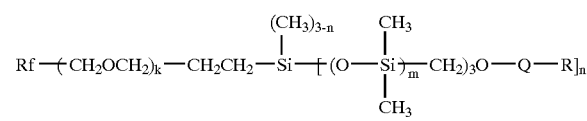

(4)

wherein Rf is a perfluoroalkyl group of 4 to 10 carbon atoms or a perfluoropolyether group of 5 to 14 carbon atoms, Q is a polyether group composed of a polyethylene glycol chain and/or polypropylene glycol chain, R is hydrogen, an allyl group, an alkyl group of 1 to 4 carbon atoms, or an acyl group of 2 to 3 carbon atoms, k and m each are 0 or 1, and n is an integer of 1 to 3.

3. The resist composition of claim 1 wherein the nonionic fluorine compound (C) is present in an amount of 100 to 8,000 ppm based on the solids in the composition.

4. The resist composition of claim 1, further comprising (D) a basic compound.

5. A process for forming a resist pattern comprising the steps of:

applying the resist composition of any one of claims 1 to 4 onto a substrate to form a coating, heat treating the coating and then exposing it to ultraviolet radiation having a wavelength of at least 150 nm through a photomask, and optionally heat treating the exposed coating and developing it with a developer.

6. The resist composition of claim 1 wherein the substantially alkali-insoluble polymer (A) is insoluble in alkali.

7. The resist composition of claim 1 wherein the substantially alkali-insoluble polymer (A) is a polymer of formula (1)

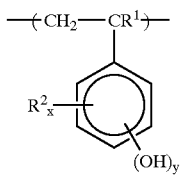 (1)

wherein R¹ is hydrogen or methyl, R² is a straight, branched or cyclic alkyl group of 1 to 8 carbon atoms, x is 0 or a positive integer, y is a positive integer, the sum of x+y is 5 or less, and wherein hydrogen atoms of some phenolic hydroxyl groups are partially substituted with acid labile groups of one or more type, in a proportion of more than 0 mol % to 80 mol % based on the entire hydrogen atoms of phenolic hydroxyl groups; and wherein the polymer has a weight average molecular weight of 3,000 to 300,000.

8. The resist composition of claim 1 wherein the photoacid generator (B) is selected from the group consisting of oxime sulfonate compounds, onium salts, β-ketosulfone derivatives, diazomethane derivatives, disulfone derivatives, sulfonic acid ester derivatives, imidoyl sulfonate derivatives, and mixtures thereof.

9. The resist composition of claim 1 wherein the photoacid generator comprises 0.5 to 15 parts by weight per 80 parts of the substantially alkali-insoluble polymer (A).

10. The resist composition of claim 1 wherein the photoacid generator comprises 1 to 8 parts by weight per 80 parts of the substantially alkali-insoluble polymer (A).

11. The resist composition of claim 1 wherein the basic compound (D) is a member selected from the group consisting of primary amines, secondary amines, tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, imide derivatives and mixtures thereof.

* * * * *